(12) United States Patent
Sampo et al.

(10) Patent No.: US 9,799,958 B2
(45) Date of Patent: Oct. 24, 2017

(54) MICROSTRIP ANTENNA

(71) Applicant: YOKOWO CO., LTD., Kita-ku (JP)

(72) Inventors: Takeshi Sampo, Tomioka (JP);
Kazuhiro Kowaita, Tomioka (JP)

(73) Assignee: YOKOWO CO., LTD., Tokyo (JP)

( * ) Notice: Subject to any disclaimer, the term of this patent is extended or adjusted under 35 U.S.C. 154(b) by 0 days.

(21) Appl. No.: 14/903,163

(22) PCT Filed: May 16, 2014

(86) PCT No.: PCT/JP2014/063031
§ 371 (c)(1),
(2) Date: Mar. 30, 2016

(87) PCT Pub. No.: WO2015/004992
PCT Pub. Date: Jan. 15, 2015

(65) Prior Publication Data
US 2016/0211581 A1    Jul. 21, 2016

(30) Foreign Application Priority Data
Jul. 9, 2013    (JP) .................................. 2013-143207

(51) Int. Cl.
*H01Q 9/04* (2006.01)
*H01Q 13/10* (2006.01)
*H03H 7/48* (2006.01)

(52) U.S. Cl.
CPC ......... *H01Q 9/0442* (2013.01); *H01Q 9/0435* (2013.01); *H01Q 13/106* (2013.01); *H03H 7/48* (2013.01)

(58) Field of Classification Search
CPC .................. H01Q 9/04; H01Q 13/10

USPC ......................................... 343/860
See application file for complete search history.

(56) References Cited

U.S. PATENT DOCUMENTS

| 2004/0012527 A1* | 1/2004 | Yuanzhu | H01Q 9/0435 343/700 MS |
| 2010/0283705 A1* | 11/2010 | Achour | H01Q 21/065 343/844 |

FOREIGN PATENT DOCUMENTS

| JP | S62-043906 A | 2/1987 |
| JP | 2004-056204 A | 2/2004 |
| JP | 2004-215245 A | 7/2004 |
| JP | 2006-237904 A | 9/2006 |
| JP | 2006-311300 A | 11/2006 |
| JP | 2013-016947 A | 1/2013 |

OTHER PUBLICATIONS

International Search Report dated Jul. 22, 2014, for International application No. PCT/JP2014/063031.

* cited by examiner

*Primary Examiner* — Dameon E Levi
*Assistant Examiner* — Andrea Lindgren Baltzell
(74) *Attorney, Agent, or Firm* — Morgan, Lewis & Bockius LLP

(57) ABSTRACT

A microstrip antenna has two feed points. The microstrip antenna includes a feeder circuit which is configured to feed, to the two feed points, electric signals whose phases are different by 90° from each other. The feeder circuit includes a Wilkinson coupler unit and a phase-shift unit each of which is formed as a lumped constant circuit.

7 Claims, 16 Drawing Sheets

MICROSTRIP ANTENNA

TECHNICAL FIELD

The present invention relates to a microstrip antenna having two feed points.

BACKGROUND ART

GNSS (Global Navigation Satellite Systems) is a general term for positioning systems using satellite. The GNSS includes GPS (Global Positioning System), GLONASS (Global Navigation Satellite System) and GALILEO. Frequency bands of the respective satellite positioning systems are as follows.

GPS (L1) 1575.42±1.023 MHz
GALILEO (E1) 1575.42±2.046 MHz
GLONASS (L1) 1595.051 MHz to 1605.8865 MHz

Therefore, in case that full bandwidth of the GPS, the GLONASS and the GALILEO is intended to be covered by one microstrip antenna, requirements of the antenna such as an axial ratio have to be satisfied in a wide frequency band (whose bandwidth is 32.5125 MHz) of 1573.374 MHz to 1605.8865 MHz. The frequency band of 1573.374 MHz to 1605.8865 MHz will be hereinafter also mentioned as "GNSS frequency band".

FIG. 9 is a perspective view of a first configuration example of a one-point-feed microstrip antenna. In FIG. 9, a ceramic plate 13 (dielectric plate) is provided on a central portion of a substrate 14 serving as a ground conductor. A silver electrode 12 (patch electrode) serving as an antenna element is formed in the ceramic plate 13. Electric power is fed to the silver electrode 12 by one feed pin 11 that pierces through the substrate 14 and the ceramic plate 13. FIG. 10 is a frequency characteristic graph of an axial ratio in the case where the ceramic plate 13 measures 20 mm×20 mm×4 mm and the substrate 14 measures 60 mm×60 mm×0.8 mm in the microstrip antenna in FIG. 9. Although it is desirable that the axial ratio is normally equal to or lower than 4 dB, the axial ratio deteriorates up to 15 dB within the GNSS frequency band in the characteristics shown in FIG. 10.

FIG. 11 is a perspective view of a second configuration example of the one-point-feed micros trip antenna. The second configuration example shown in FIG. 11 is different from the first configuration example shown in FIG. 9 in the point that a large conductor ground plate is separately provided for antenna operation in addition to the substrate 14. In this case, the substrate 14 is released from the function as the ground for antenna operation, so that the substrate 14 can be miniaturized. As examples of the dimensions, the substrate 14 measures 21 mm×21 mm×0.8 mm and the conductor ground plate 15 measures 60 mm×60 mm. Also in the second configuration example, the frequency characteristics of the axial ratio are substantially the same as those in the first configuration example shown in FIG. 10.

FIG. 12 is a perspective view of a third configuration example of the one-point-feed microstrip antenna. The third configuration example shown in FIG. 12 is different from the first configuration example shown in FIG. 9 in the point that the size of the ceramic plate 13 and the size of the silver electrode 12 are increased. FIG. 13 is a frequency characteristic graph of an axial ratio in the case where the ceramic plate 13 measures 50 mm×50 mm×4 mm and the substrate 14 measures 60 mm×60 mm×0.8 mm in the microstrip antenna in FIG. 12. It will be understood by comparison between FIG. 10 and FIG. 13 that the axial ratio is improved due to the increase in size. However, even in the frequency characteristics of FIG. 13, the axial ratio deteriorates up to 4.5 dB within the GNSS frequency band so it cannot be said that the antenna has sufficient performance for use as a GNSS antenna.

In this manner, the one-point-feed microstrip antenna has a simple configuration but the size of the microstrip antenna increases inevitably when the operable frequency band is intended to be widened. It is difficult to obtain the required axial ratio (for example, which is equal to or lower than 4 dB) within the GNSS frequency band even if the size of the microstrip antenna is increased. As another method for widening the frequency band of a microstrip antenna, it is effective that two feed points are provided and electric signals whose phases are different by 90° from each other are fed to the two feed points.

FIG. 14 is a perspective view of a two-point-feed microstrip antenna. A ceramic plate 13 measures, for example, 20 mm×20 mm×4 mm. In the case of the two-point-feed system, a feeder circuit providing signals with a phase difference of 90° at the two feed pins 11 has to be mounted on a substrate 14.

FIG. 15 is a perspective view of the substrate 14 in which a hybrid circuit called branch-line coupler is provided as the feeder circuit. Each side of a conductor pattern 16 formed substantially into a square shape has a length of approximately λ/4. When the substrate 14 is, for example, a glass epoxy substrate, λ/4 corresponds to about 27 mm, taking into account the shortening effect due to a dielectric constant of the substrate 14. In addition, when an LNA (Low Noise Amplifier), a cable attachment pattern, etc. are also disposed to the substrate 14, the size of the substrate 14 is required to be equal to or larger than, for example, 40 mm×40 mm. Thus, the size of the substrate as a microstrip antenna becomes large.

FIG. 16 is a perspective view of a substrate 14 provided with a hybrid circuit, as a feeder circuit, in which a λ/4 transmission line is added to one output of a Wilkinson divider. A conductor pattern 17 is the Wilkinson divider and a conductor Pattern 18 is the λ/4 transmission line. In this case, the size of the substrate 14 is further larger than that in the case of the branch-line coupler. Thus, the size of the substrate as a microstrip antenna becomes large.

PRIOR ART REFERENCE

Patent Reference

[Patent Reference 1] JP-A-2004-56204
[Patent Reference 2] JP-A-2013-16947

SUMMARY OF INVENTION

Problems that Invention is to Solve

The invention has been accomplished in consideration of recognition of such circumstances. It is an object of the invention to provide a microstrip antenna capable of obtaining an excellent axial ratio in a required frequency band while being more compact than in the background art.

Means for Solving Problems

An aspect of the invention is a microstrip antenna. The microstrip antenna has two feed points and comprises a feeder circuit which is configured to feed, to the two feed points, electric signals whose phases are different by 90° from each other. The feeder circuit includes a Wilkinson coupler unit and a phase-shift unit each of which is formed as a lumped constant circuit.

A distance between each of the feed points and a center of a patch electrode may be larger than a distance in which impedance is matched.

A size of a dielectric body in which the patch electrode is formed may be equal to or smaller than 25 mm×25 mm, and the distance between the feed point and the center of the patch electrode may be set so that an antenna gain in a desired frequency range is equal to or larger than 0 dBic.

A size of a dielectric body in which the patch electrode is formed may be equal to or smaller than 25 mm×25 mm, the microstrip antenna may comprise a substrate in which the feeder circuit is formed on a back surface opposite to a surface where the dielectric body is provided, and a length and width of the substrate may be substantially equal to or smaller than a length and width of the dielectric body.

A size of a dielectric body in which the patch electrode is formed may be equal to or smaller than 25 mm×25 mm, and the distance between each of the feed points and the center of the patch electrode may be set to be larger than the distance in which the impedance is matched, so that an antenna gain in a frequency range of 1573.374 MHz to 1605.8865 MHz is equal to or larger than 1 dBic.

A size of a dielectric body in which the patch electrode is formed may be equal to or smaller than 20 mm×20 mm, and the distance between each of the feed points and the center of the patch electrode may be set to be larger than the distance in which the impedance is matched, so that an antenna gain in a frequency range of 1573.374 MHz to 1605.8865 MHz is equal to or larger than 0 dBic.

A size of a dielectric body in which the patch electrode is formed may be 20 mm×20 mm×4 mm, and an antenna gain in a frequency range of 1573.374 MHz to 1605.8865 MHz may be equal to or larger than 0 dBic.

A size of a dielectric body in which the patch electrode is formed may be 25 mm×25 mm×7 mm, and an antenna gain in a frequency range of 1573.374 MHz to 1605.8865 MHz may be equal to or larger than 3 dBic.

Incidentally, any combination of the aforementioned constituent elements or any change of expression of the invention into a method or a system etc. is also effective as an aspect of the invention.

Advantage of Invention

According to the invention, it is possible to provide a microstrip antenna which can be designed to have an excellent axial ratio in a required frequency band while being more compact than in the background art.

MODE FOR CARRYING OUT INVENTION

Figure 1:
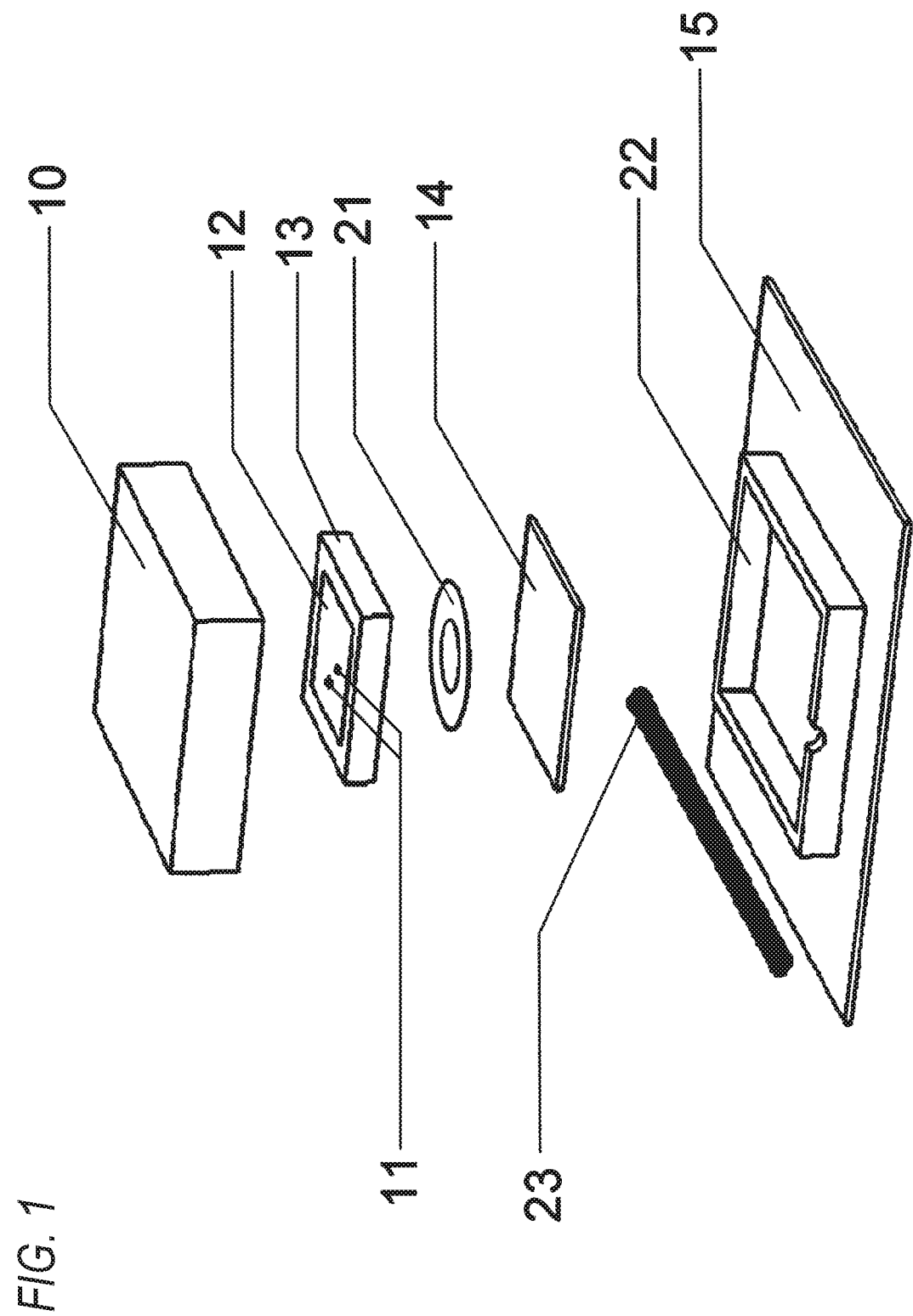
FIG. 1 is an exploded perspective view of a microstrip antenna according to an embodiment of the invention.

Preferred embodiments of the invention will be described below in detail with reference to the drawings. In the embodiments, the same or equivalent constituent elements, members, etc. shown in the drawings will be referred to by the same reference numerals correspondingly and respectively, and duplicate description thereof will be omitted suitably. In addition, each embodiment does not restrict the invention but is simply exemplary, and all features described in the embodiment or their combinations are not always essential to the invention.

FIG. 1 is an exploded perspective view of a microstrip antenna according to an embodiment of the invention. In FIG. 1, a ceramic plate 13 (dielectric plate) is provided (for example, bonded by a double sided tape 21) on a central portion of a substrate 14. A silver electrode 12 (patch electrode) serving as an antenna element is formed on a main surface of the ceramic plate 13. Electric power is fed to the silver electrode 12 by two feed pins 11. The ceramic plate 13 and the substrate 14 are fixedly disposed inside a frame-like base 22 and covered with a radome 10 from above. The radome 10 and the base 22 are integrally fixed with a conductor ground plate 15. A coaxial cable 23 is lead into the base 22. A signal wire of the coaxial cable 23 is connected to an input terminal 26 of a feeder circuit shown in FIG. 2 through an LNA (Low Noise Amplifier). A shield wire (ground wire) of the coaxial cable 23 is electrically connected to a ground terminal of the substrate 14.

Figure 2:
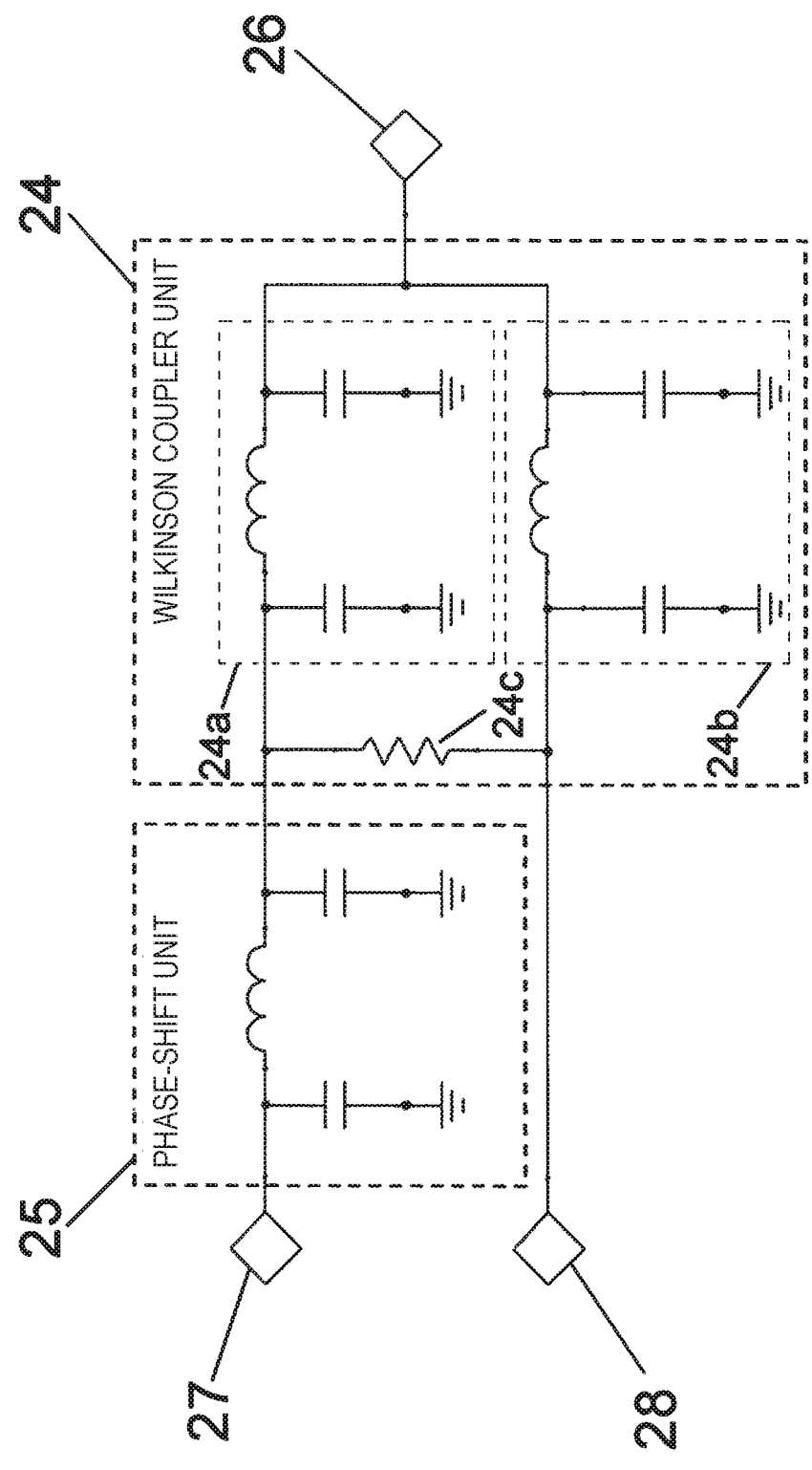
FIG. 2 is a circuit diagram of a feeder circuit (hybrid circuit) of the microstrip antenna shown in FIG. 1.

FIG. 2 is a circuit diagram of the feeder circuit (hybrid circuit) of the microstrip antenna shown in FIG. 1. The feeder circuit is provided together with the LNA on the back of the substrate 14 opposite to the surface where the antenna element is mounted. By the feeder circuit, electric signals whose phases are different by 90° from each other are fed to the two feed pins 11 (that is, the two feed points) piercing through the substrate 14 and the ceramic plate 13.

The feeder circuit is provided with a Wilkinson coupler unit 24 and a phase-shift unit 25 as shown in FIG. 2. The Wilkinson coupler unit 24 is a circuit which divides an input signal (electric power) from the input terminal 26 into two parts. Here, the Wilkinson coupler unit 24 includes two π-type filters 24a and 24b and a resistor 24c. The π-type filters 24a and 24b are connected to each other in parallel, and the resistor 24c is connected between output terminals of the π-type filters 24a and 24b. The cutoff frequency of each of the π-type filters 24a and 24b is set, for example, at any frequency within a GNSS frequency band, preferably, a frequency (approximately 1590 MHz) to be the center within the GNSS frequency band. The π-type filter 24a, 24b may be any of a high-pass filter and a low-pass filter. A T-type filter may be used in place of the π-type filter 24a, 24b.

The phase-shift unit 25 is connected to one output terminal (the output terminal of the π-type filter 24a) of the Wilkinson coupler unit 24. Here, the phase-shift unit 25 is a π-type filter whose cutoff frequency is set, for example, at any frequency within the GNSS frequency band, preferably a frequency (approximately 1590 MHz) to be the center within the GNSS frequency band. Any of a high-pass filter and a low-pass filter may be used as the phase-shift unit 25. The phase-shift unit 25 may be a T-type filter.

Respective capacitors, respective coils and the resistor constituting the Wilkinson coupler unit 24 and the phase-shift unit 25 are lumped constant elements (discrete components) which are formed by chip components (chip capacitors, chip coils and a chip resistor) here. An electric signal transmitted through one of the π-type filter 24a and the phase-shift unit 25 is fed from an output terminal 27 to one of the feed pin 11. The other π-type filter 24b is connected to an output terminal 28. An electric signal transmitted through the other π-type filter 24b is fed from the output terminal 28 to the other feed pin 11. Phases of the electric signals (the signals of the GNSS frequency band) fed to the two feed pins 11 are different by 90° from each other. The feeder circuit shown in FIG. 2 is constituted by the lumped constant elements. The Wilkinson coupler unit 24 which distributes electric power and the phase-shift unit 25 which shifts the phase by 90° are completely separated each other as circuit units. Therefore, a desired hybrid circuit may be configured easily by optimizing the Wilkinson coupler unit 24 and the phase-shift unit 25 individually.

Figure 3:
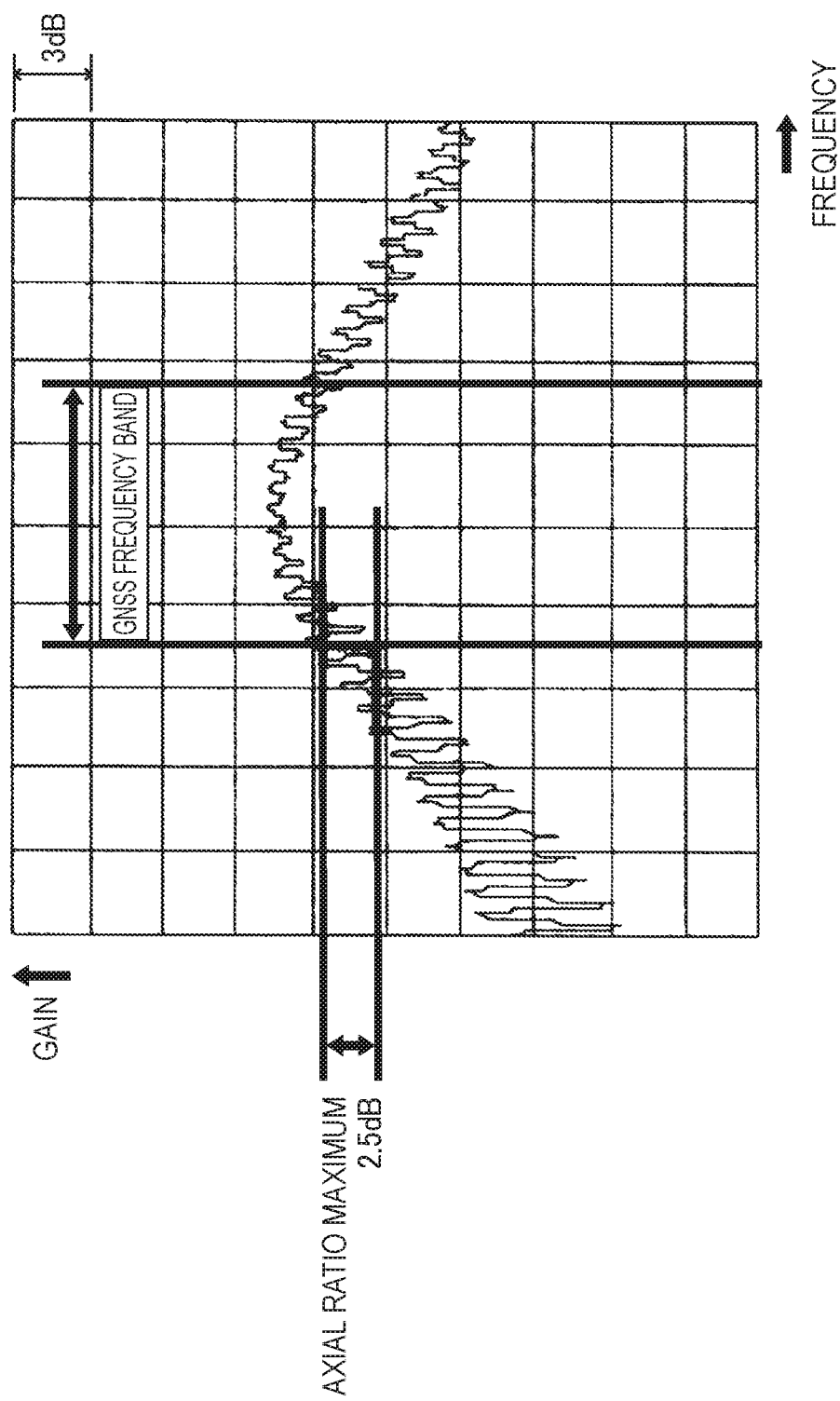
FIG. 3 is a frequency characteristic graph of an axial ratio when a ceramic plate 13 measures 20 mm×20 mm×4 mm and a substrate 14 measures 21 mm×21 mm×0.8 mm in the microstrip antenna according to the embodiment.

FIG. 3 is a frequency characteristic graph of an axial ratio when the ceramic plate 13 measures 20 mm×20 mm×4 mm and the substrate 14 measures 21 mm×21 mm×0.8 mm in the microstrip antenna according to the embodiment. As shown in FIG. 3, the microstrip antenna according to the embodiment is configured to have two feed points while the ceramic plate 13 is made as compact as 20 mm×20 mm×4 mm. Thus, the axial ratio within the GNSS frequency band is suppressed to be at most 2.5 dB. In addition, the feeder circuit is constituted by the lumped constant elements as shown in FIG. 2. Accordingly, it is possible to make the substrate 14 as compact as 21 mm×21 mm×0.8 mm, and it is possible to satisfy the requirement of the axial ratio (for example, which is equal to or lower than 4 dB) as a GNSS microstrip antenna and to make the microstrip antenna more compact than in the background art.

Figure 4:
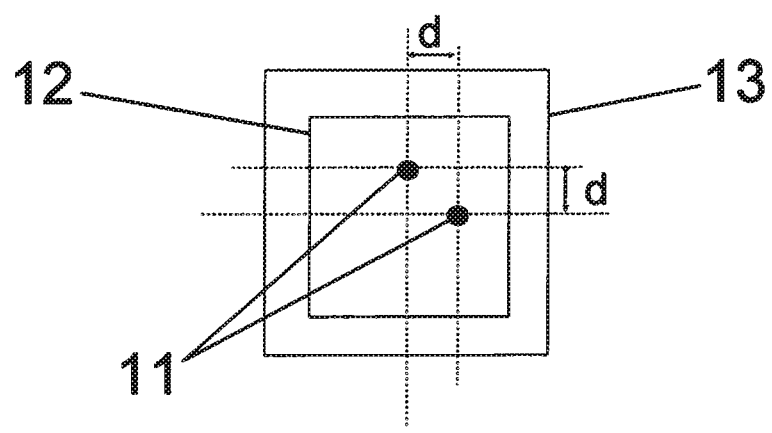
FIG. 4 is a plan view of the ceramic plate 13 shown in FIG. 1.

FIG. 4 is a plan view of the ceramic plate 13 shown in FIG. 1. A distance d in FIG. 4 expresses a distance between the center of the silver electrode 12 and each feed point (the position of each of the feed pins 11). Conventionally, the distance d is set at a distance in which impedance can be matched with the antenna element in the operating frequency band. However, in the embodiment, the distance d is intentionally set to be larger than the distance in which impedance can be matched. Thus, the bandwidth with sufficient antenna gain can be widened. When the distance d is set to be larger than the distance in which impedance can be matched, there may arise a problem of reflection. However, the feeder circuit (hybrid circuit) shown in FIG. 2 can suppress deterioration of a VSWR (Voltage Standing Wave Ratio) caused by the reflection to a negligible extent (for example, which is equal to or lower than 2). This is because the phases of reflected waves from the output terminals 27 and 28 are shifted from each other by $\lambda/2$ in the feeder circuit shown in FIG. 2. That is, a signal reflected by one of the feed point 11, which signal is inputted from the input terminal 26 and reaches the output terminal 27, passes through both the Wilkinson coupler unit 24 and the phase-shift unit 25 once in one way. Accordingly, a phase delay of $\lambda$ relative to the input signal is generated. On the other hand, a signal reflected by the other feed point 11, which signal is inputted from the input terminal 26 and reaches the output terminal 28, passes through only the Wilkinson coupler unit 24 once in one way (without passing through the phase-shift unit 25). Accordingly, a phase delay of only $\lambda/2$ relative to the input signal is generated. Therefore, the phases of the reflected waves from the output terminals 27 and 28 are shifted by $\lambda/2$ from each other. Due to cancellation of the reflected waves generated by this shift, deterioration of the VSWR can be reduced.

Below describes the distance (the distance between the center of the silver electrode 12 and the feed point) in which impedance can be matched (with 50Ω) in various microstrip antennas with general sizes. In each of the following microstrip antennas, the size and dielectric constant are those of the ceramic plate 13.

Figure 5:
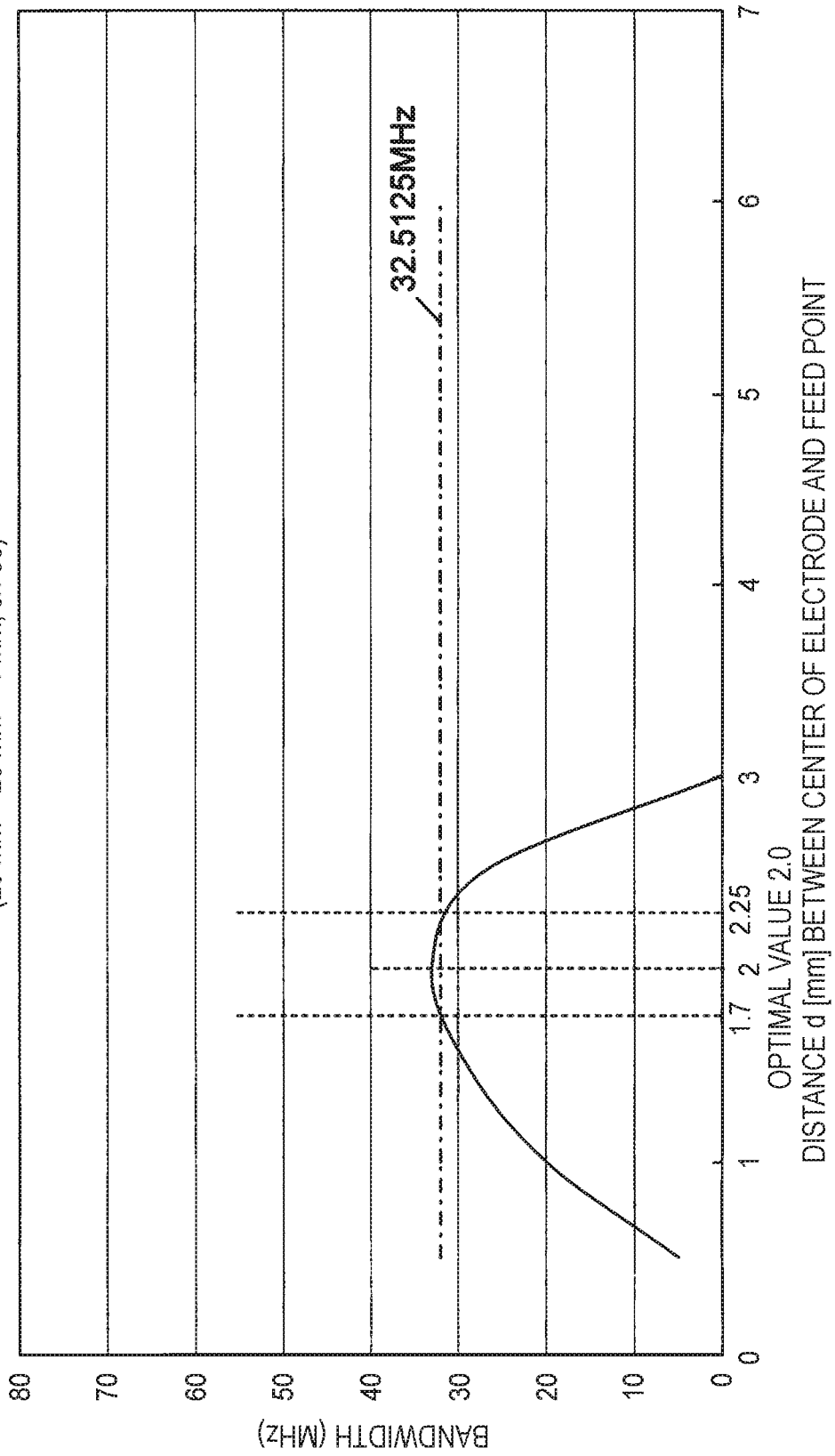
FIG. 5 is a characteristic graph showing the relation between a distance d between the center of a silver electrode 12 and each of feed points and a bandwidth (having a band center at approximately 1590 MHz) in which an antenna gain was equal to or larger than 0 dBic, when the ceramic plate 13 measures 20 mm×20 mm×4 mm and the dielectric constant ∈r is 38 in the microstrip antenna according to the embodiment.

Size: 20 mm×20 mm×4 mm, $\in r$: 38, distance in which impedance can be matched: 1.0 mm Size: 20 mm×20 mm×7 mm, $\in r$: 38, distance in which impedance can be matched: 1.5 mm Size: 25 mm×25 mm×4 mm, ∈r: 20, distance in which impedance can be matched: 2.0 mm Size: 25 mm×25 mm×7 mm, ∈r: 20, distance in which impedance can be matched: 2.5 mm FIG. 5 is a characteristic graph showing the relation between the distance d measured from the center of the silver electrode 12 to the feed point and a bandwidth (having a band center frequency at approximately 1590 MHz) in which an antenna gain is equal to or larger than 0 dBic, when the ceramic plate 13 measures 20 mm×20 mm×4 mm and a dielectric constant ∈r is 38 in the microstrip antenna according to the embodiment. In such microstrip antenna, the substrate 14 measures 21 mm×21 mm×0.8 mm.

In the case where the ceramic plate 13 measures 20 mm×20 mm×4 mm and the dielectric constant ∈r is 38, as described above, impedance can be matched when the distance between the center of the silver electrode 12 and the feed point is 1.0 mm. However, as apparent from FIG. 5, when the distance d between the center of the silver electrode 12 and the feed point is 1.0 mm, the bandwidth in which the antenna gain is equal to or larger than 0 dBic is lower than 32.5125 MHz. On the other hand, when the distance d between the center of the silver electrode 12 and the feed point is set at 1.7 mm to 2.25 mm, the bandwidth in which the antenna gain was equal to or larger than 0 dBic is equal to or higher than 32.5125 MHz (the antenna gain is equal to or larger than 0 dBic in a frequency hand of 1573.374 MHz to 1605.8865 MHz). Preferably, the distance d is set at 2.0 mm, where the broadest bandwidth is obtained. It has been proved from the above description that when the distance between the center of the silver electrode 12 and the feed point is set to be larger than the distance in which impedance can be matched, the ceramic plate 13 can be made compact to be equal to or smaller than 20 mm×20 mm×4 mm and the antenna gain in the frequency band of 1573.374 MHz to 1605.8865 MHz can be made equal to or larger than 0 dBic.

Incidentally, although not shown in the drawings, in the case where the ceramic plate 13 measures 25 mm×25 mm×4 mm or 25 mm×25 mm×7 mm and the dielectric constant ∈r is 20, or in the case where the ceramic plate 13 measures 20 mm×20×mm×7 mm and the dielectric constant ∈r is 38, the bandwidth in which the antenna gain is equal to or larger than 0 dBic can be secured to be equal to or higher than 32.5125 MHz (the antenna gain is equal to or larger than 0 dBic in the frequency band of 1573.374 MHz to 1605.8865 MHz) even when the distance d between the center of the silver electrode 12 and the feed point is set at the distance in which impedance can be matched (that is, d is set to be not larger than the predetermined distance).

Figure 6:
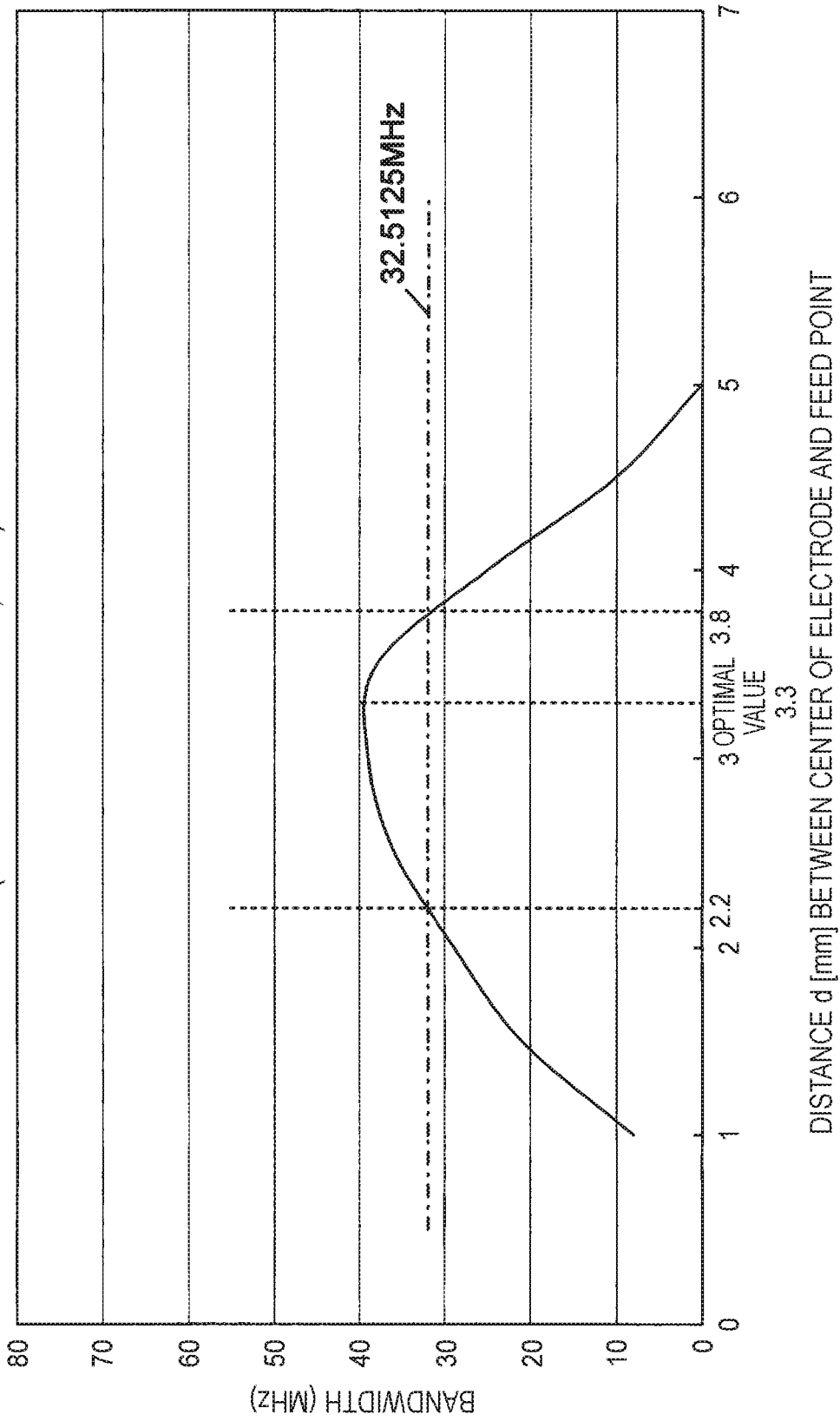
FIG. 6 is a characteristic graph showing the relation between the distance d between the center of the silver electrode 12 and the feed point and a bandwidth (having a band center at approximately 1590 MHz) in which an antenna gain was equal to or larger than 1 dBic, when the ceramic plate 13 measures 25 mm×25 mm×4 mm and the dielectric constant ∈r is 20 in the microstrip antenna according to the embodiment.

FIG. 6 is a characteristic graph showing the relation between the distance d measured from the center of the silver electrode 12 to the feed point and a bandwidth (having a band center frequency at approximately 1590 MHz) in which an antenna gain is equal to or larger than 1 dBic, when the ceramic plate 13 measures 25 mm×25 mm×4 mm and the dielectric constant ∈r is 20 in the microstrip antenna according to the embodiment. In such microstrip antenna, the substrate 14 measures 26 mm×26 mm×0.8 mm.

In the case where the ceramic plate 13 measures 25 mm×25 mm×4 mm and the dielectric constant ∈r is 20, as described above, impedance can be matched when the distance between the center of the silver electrode 12 and the feed point is 2.0 mm. However, as apparent from FIG. 6, when the distance d between the center of the silver electrode 12 and the feed point is 2.0 mm, the bandwidth in which the antenna gain is equal to or larger than 1 dBic is lower than 32.5125 MHz. On the other hand, when the distance d between the center of the silver electrode 12 and the feed point is set at 2.2 mm to 3.8 mm, the bandwidth in which the antenna gain is equal to or larger than 1 dBic is equal to or higher than 32.5125 MHz (the antenna gain can be made equal to or larger than 1 dBic in a frequency band of 1573.374 MHz to 1605.8865 MHz). Preferably, the distance d is set at 3.3 mm, where the broadest bandwidth is obtained. It has been proved from the above description that when the distance between the center of the silver electrode 12 and the feed point is set to be larger than the distance in which impedance can be matched, the ceramic plate 13 can be made compact to be equal to or smaller than 25 mm×25 mm×4 mm and the antenna gain in the frequency band of 1573.374 MHz to 1605.8865 MHz can be made equal to or larger than 1 dBic.

Incidentally, although not shown in the drawings, in the case where the ceramic plate 13 measures 20 mm×20 mm×7 mm and the dielectric constant ∈r is 38, or in the case where the ceramic plate 13 measures 25 mm×25 mm×7 mm and the dielectric constant ∈r is 20, the bandwidth in which the antenna gain is equal to or larger than 1 dBic can be secured to be equal to or higher than 32.5125 MHz (the antenna gain was equal to or larger than 1 dBic in the frequency band of 1573.374 MHz to 1605.8865 MHz) even when the distance d between the center of the silver electrode 12 and the feed point is set at the distance in which impedance can be matched.

Figure 7:
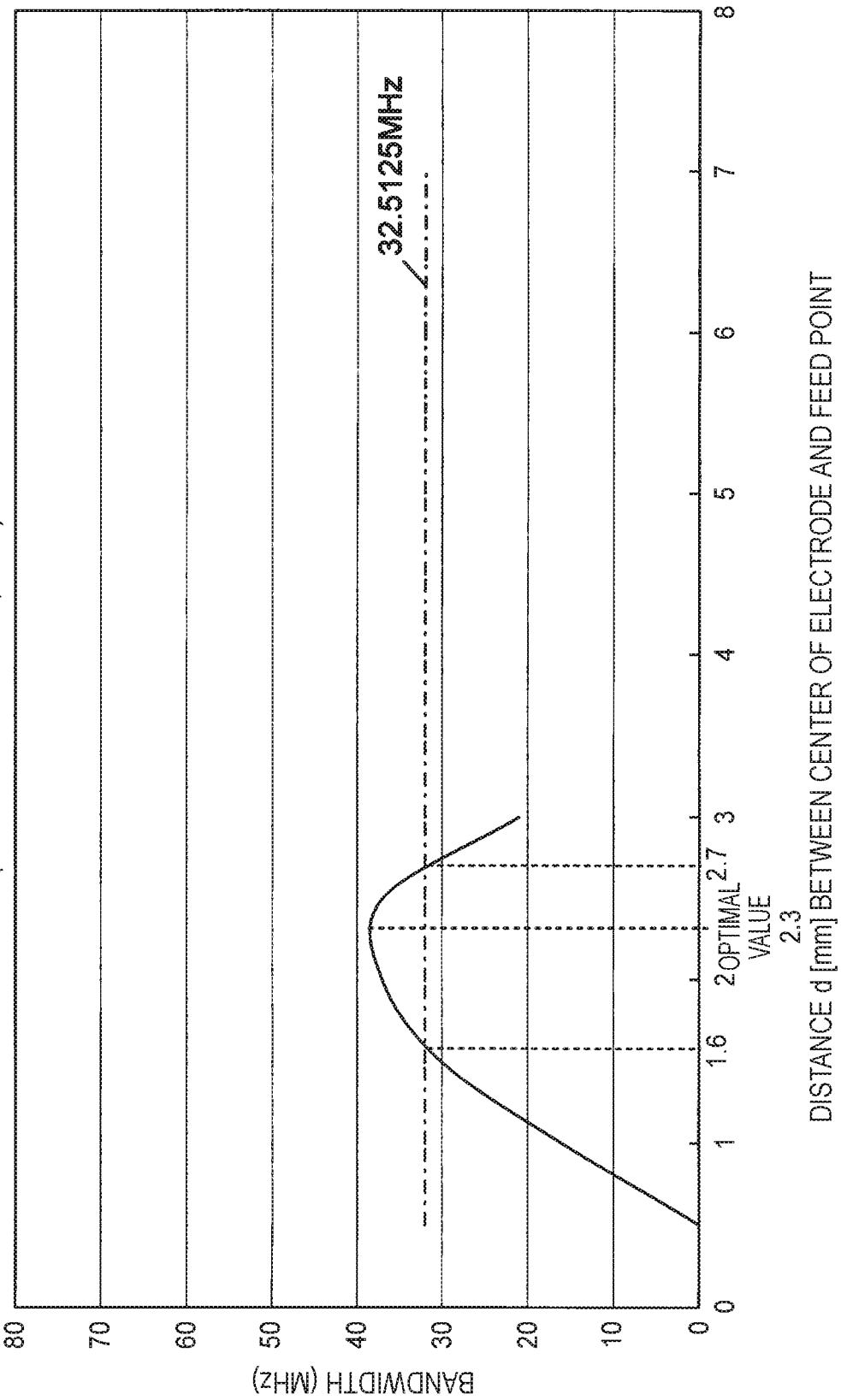
FIG. 7 is a characteristic graph showing the relation between the distance d between the center of the silver electrode 12 and the feed point and a bandwidth (having a band center at approximately 1590 MHz) in which an antenna gain is equal to or larger than 2 dBic, when the ceramic plate 13 measured 20 mm×20 mm×7 mm and the dielectric constant ∈r is 38 in the microstrip antenna according to the embodiment.

FIG. 7 is a characteristic graph showing the relation between the distance d measured from the center of the silver electrode 12 to the feed point and a bandwidth (having a band center frequency at approximately 1590 MHz) in which an antenna gain is equal to or larger than 2 dBic, when the ceramic plate 13 measures 20 mm×20 mm×7 mm and the dielectric constant ∈r is 38 in the microstrip antenna according to the embodiment. In such microstrip antenna, the substrate 14 measures 21 mm×21 mm×0.8 mm.

In the case where the ceramic plate 13 measures 20 mm×20 mm×7 mm and the dielectric constant ∈r is 38, as described above, impedance can be matched when the distance between the center of the silver electrode 12 and the feed point is 1.5 mm. However, as apparent from FIG. 7, when the distance d between the center of the silver electrode 12 and the feed point is 1.5 mm, the bandwidth in which the antenna gain is equal to or larger than 2 dBic was lower than 32.5125 MHz. On the other hand, when the distance d between the center of the silver electrode 12 and the feed point is set at 1.6 mm to 2.7 mm, the bandwidth in which the antenna gain was equal to or larger than 2 dBic can be made equal to or higher than 32.5125 MHz (the antenna gain is equal to or larger than 2 dBic in the frequency band of 1573.374 MHz to 1605.8865 MHz). Preferably, the distance d is set at 2.3 mm, where the broadest bandwidth is obtained. It has been proved from the above description that when the distance between the center of the silver electrode 12 and the feed point is set to be larger than the distance in which impedance can be matched, the ceramic plate 13 can be made compact to be equal to or smaller than 20 mm×20 mm×7 mm and the antenna gain in the frequency band of 1573.374 MHz to 1605.8865 MHz can be made equal to or larger than 2 dBic.

Incidentally, although not shown in the drawings, in the case where the ceramic plate 13 measures 25 mm×25 mm×7 mm and the dielectric constant ∈r is 20, the bandwidth in which the antenna gain is equal to or larger than 2 dBic can be secured to be equal to or higher than 32.5125 MHz (the antenna gain is equal to or larger than 2 dBic in the frequency band of 1573.374 MHz to 1605.8865 MHz) even when the distanced between the center of the silver electrode 12 and the feed point is set at the distance in which impedance can be matched.

Figure 8:
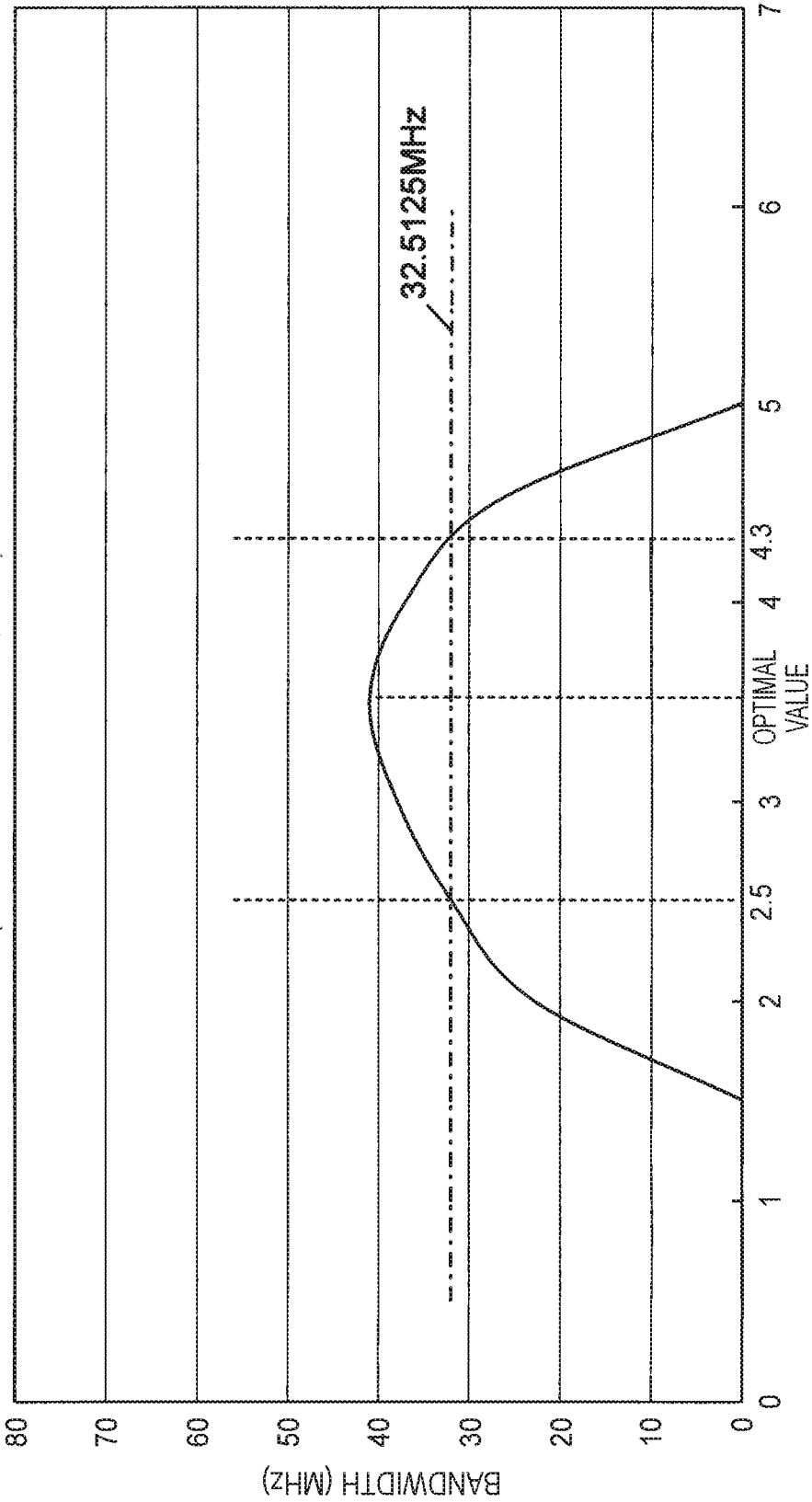
FIG. 8 is a characteristic graph showing the relation between the distance d between the center of the silver electrode 12 and the feed point and a bandwidth (having a band center at approximately 1590 MHz) in which an antenna gain is equal to or larger than 3 dBic, when the ceramic plate 13 measures 25 mm×25 mm×7 mm and the dielectric constant ∈r is 20 in the microstrip antenna according to the embodiment.
Figure 9:
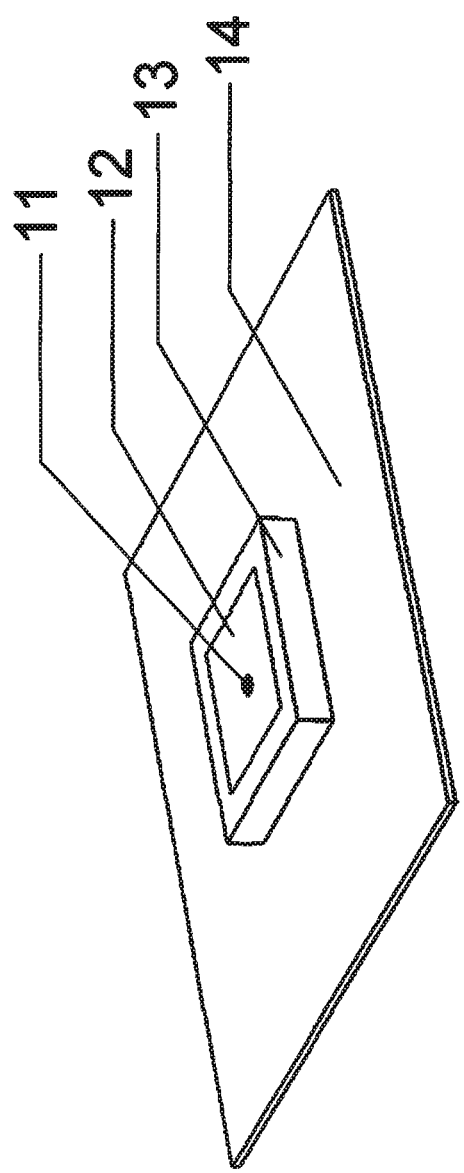
FIG. 9 is a perspective view of a first configuration example of a one-point-feed microstrip antenna in the background art.
Figure 10:
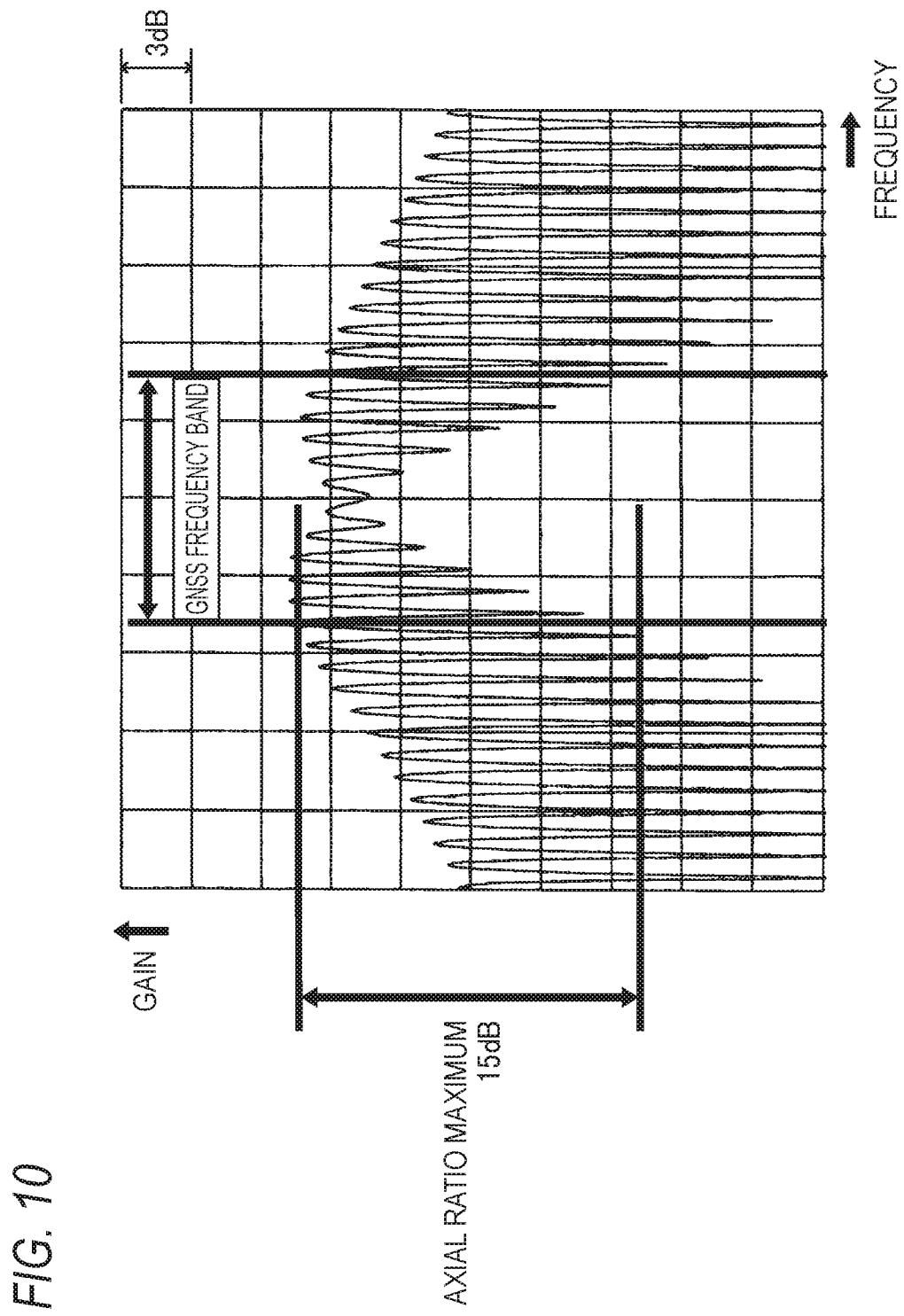
FIG. 10 is a frequency characteristic graph of an axial ratio when a ceramic plate 13 measures 20 mm×20 mm×4 mm and a substrate 14 measures 60 mm×60 mm×0.8 mm in the microstrip antenna in FIG. 9.
Figure 11:
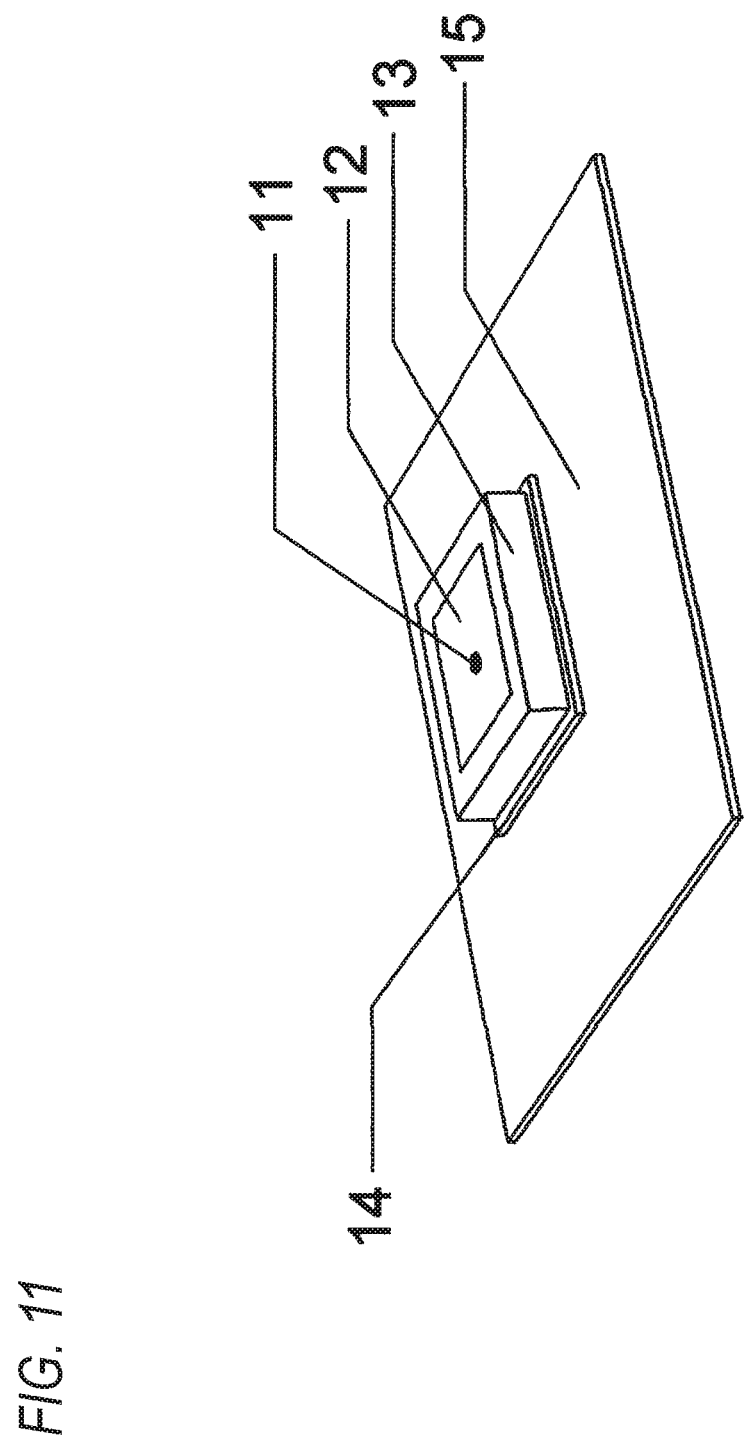
FIG. 11 is a perspective view of a second configuration example of the one-point-feed microstrip antenna in the background art.
Figure 12:
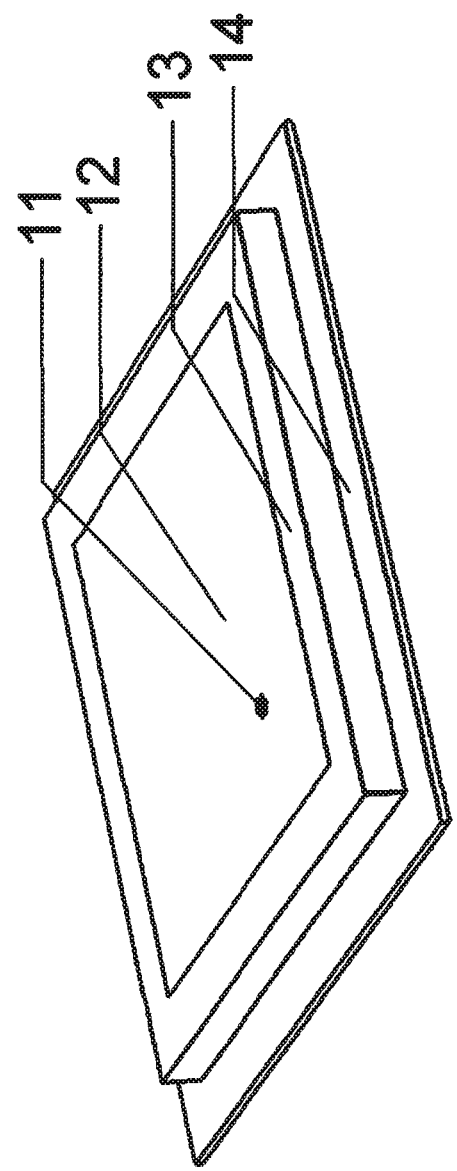
FIG. 12 is a perspective view of a third configuration example of the one-point-feed microstrip antenna in the background art.
Figure 13:
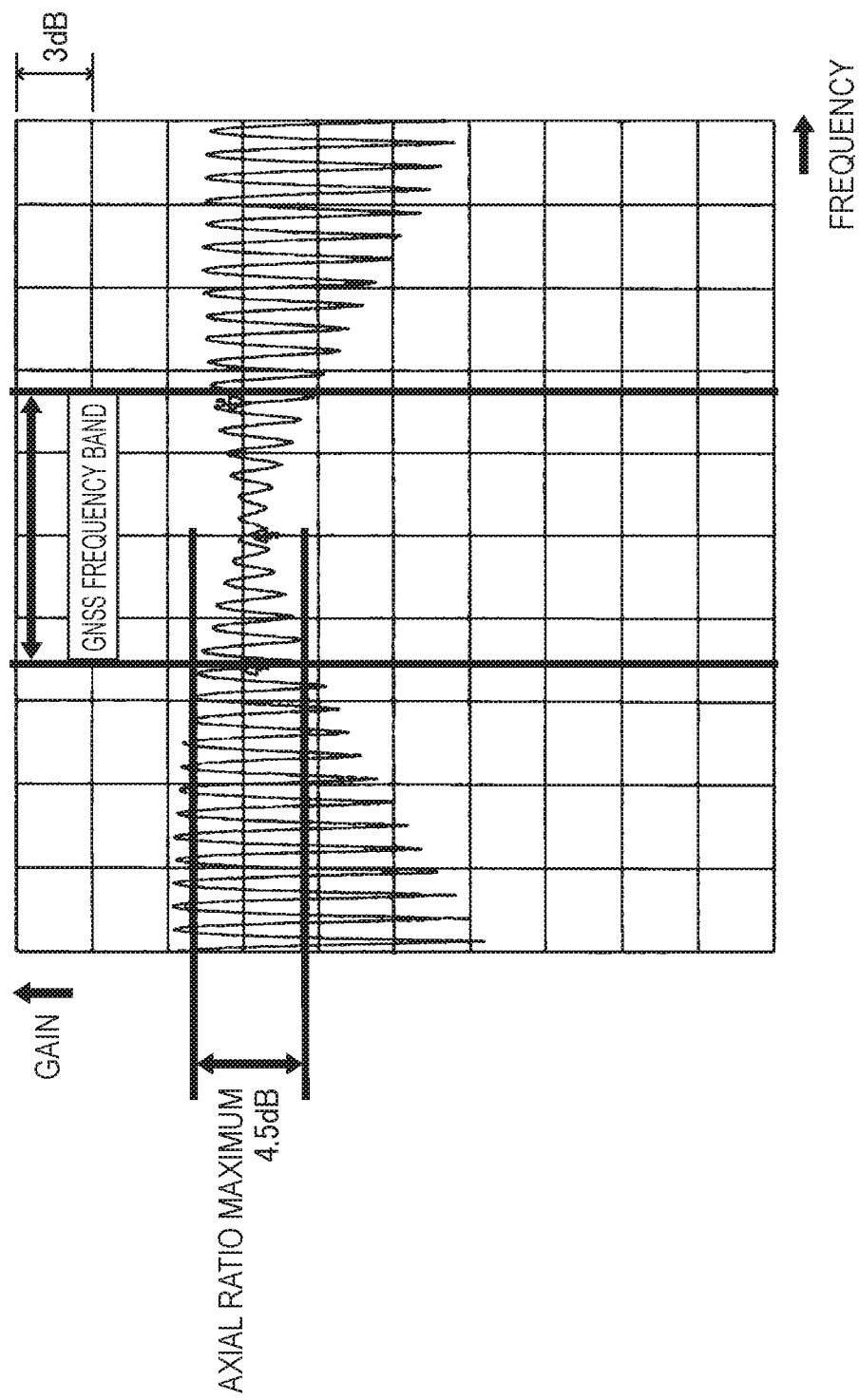
FIG. 13 is a frequency characteristic graph of an axial ratio when a ceramic plate 13 measures 50 mm×50 mm×4 mm and a substrate 14 measures 60 mm×60 mm×0.8 mm in the microstrip antenna in FIG. 12.
Figure 14:
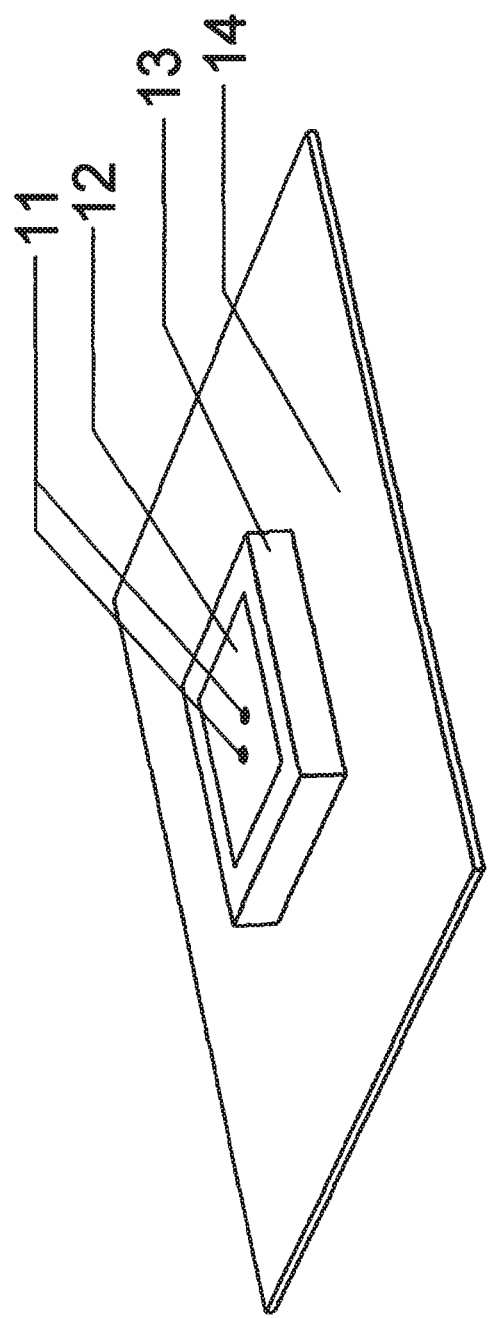
FIG. 14 is a perspective view of a two-point-feed microstrip antenna in the background art.
Figure 15:
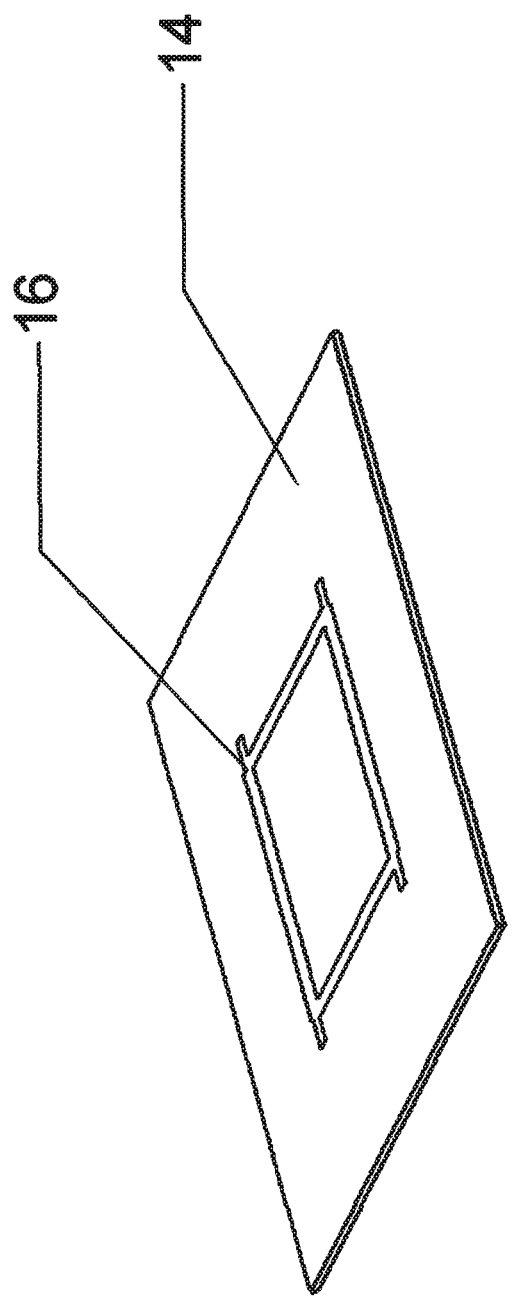
FIG. 15 is a perspective view of a substrate 14 provided with a hybrid circuit called branch-line coupler as a feeder circuit in the background art.
Figure 16:
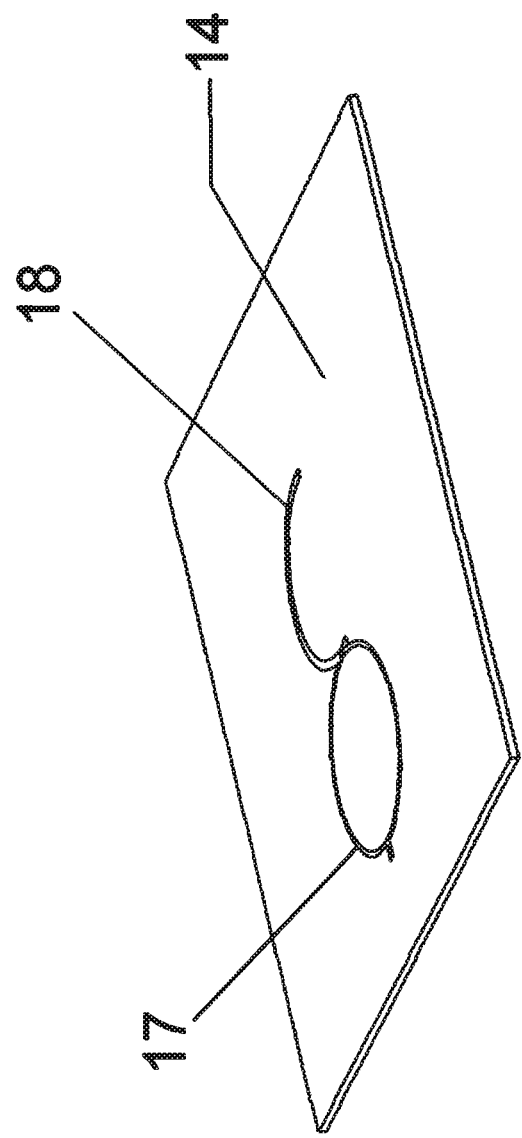
FIG. 16 is a perspective view of a substrate 14 provided with a hybrid circuit, as a feeder circuit, in which a λ/4 transmission line is added to one output of a Wilkinson divider in the background art.

FIG. 8 is a characteristic graph showing the relation between the distance d measured from the center of the silver electrode 12 to the feed point and a bandwidth (having a band center frequency at approximately 1590 MHz) in which an antenna gain is equal to or larger than 3 dBic, when the ceramic plate 13 measures 25 mm×25 mm×7 mm and the dielectric constant ∈r is 20 in the micros trip antenna according to the embodiment. In such microstrip antenna, the substrate 14 measures 26 mm×26 mm×0.8 mm.

In the case where the ceramic plate 13 measures 25 mm×25 mm×7 mm and the dielectric constant ∈r is 20, as described above, impedance can be matched when the distance between the center of the silver electrode 12 and the feed point is 2.5 mm. However, as apparent from FIG. 8, when the distance d between the center of the silver electrode 12 and the feed point is 2.5 mm, the bandwidth in which the antenna gain is equal to or larger than 3 dBic is just about 32.5125 MHz. On the other hand, when the distance d between the center of the silver electrode 12 and the feed point is in a range longer than 2.5 mm and shorter than 4.3 mm, the bandwidth in which the antenna gain is equal to or larger than 3 dBic is higher than 32.5125 MHz with a margin (the antenna gain is equal to or larger than 3 dBic in a frequency band which includes not only the frequency band of 1573.374 MHz to 1605.8865 MHz but also wider frequency band than such frequency band). Preferably, the distance d is set at 3.5 mm, where the broadest bandwidth is obtained. It has been proved from the above description that when the distance between the center of the silver electrode 12 and the feed point is larger than the distance in which impedance can be matched, the ceramic plate 13 can be made compact to be equal to or smaller than 25 mm×25 mm×7 mm and the antenna gain in the frequency band which includes not only the frequency band of 1573.374 MHz to 1605.8865 MHz but also wider frequency band than such frequency band can be made equal to or larger than 3 dBic.

According to the embodiment, the following effects can be obtained.

(1) The microstrip antenna according to the invention is configured to have two feed points and its feeder circuit is constituted by the lumped constant elements as shown in FIG. 2. Accordingly, it is possible to make the size compact as a GNSS microstrip antenna while attaining an excellent axial ratio (for example, which is equal to or lower than 4 dB) in a required wide frequency band.

(2) Each of the feed points of the microstrip antenna according to the invention is intentionally shifted from the position where impedance can be matched. Accordingly, it is possible to attain a high antenna gain in a wide frequency band while making the ceramic plate 13 compact. In addition, the influence of reflection caused by the feed points shifted from the position in which impedance can be matched can be suppressed to a negligible extent by means of insertion of the feeder circuit (hybrid circuit) shown in FIG. 2.

Although the invention has been described above in conjunction with the embodiment by way of example, it can be understood by those skilled in the art that various modifications can be made on the respective constituent elements or the respective processing processes in the embodiment within the scope of Claims.

In the embodiment, the size (the length and width) of the substrate 14 is set at an extent slightly larger than (substantially the same as) the size of the ceramic plate 13. However, the size of the substrate 14 may be smaller than the size of the ceramic plate 13.

DESCRIPTION OF REFERENCE NUMERALS 10 radome, 11 feed point, 12 silver electrode, 13 ceramic plate (dielectric plate), 14 substrate, 15 conductor ground plate, 16 to 18 conductor pattern, 21 double sided tape, 22 base, 23 coaxial cable, 24 Wilkinson couple unit, 25 phase-shift unit, 26 input terminal

The invention claimed is:

1. A microstrip antenna having two feed points, the microstrip antenna comprising a feeder circuit which is configured to feed, to the two feed points, electric signals whose phases are different by 90° from each other, the feeder circuit including a Wilkinson coupler unit and a phase-shift unit each of which is formed as a lumped constant circuit,
wherein a distance between each of the feed points and a center of a patch electrode is larger than a distance in which impedance is matched.

2. The microstrip antenna according to claim 1, wherein a size of a dielectric body in which the patch electrode is formed is equal to or smaller than 25 mm×25 mm, and the distance between the feed point and the center of the patch electrode is set so that an antenna gain in a desired frequency range is equal to or larger than 0 dBic.

3. The microstrip antenna according to claim 1, wherein a size of a dielectric body in which the patch electrode is formed is equal to or smaller than 25 mm×25 mm, the microstrip antenna comprises a substrate in which the feeder circuit is formed on a back surface opposite to a surface where the dielectric body is provided, and a length and width of the substrate are substantially equal to or smaller than a length and width of the dielectric body.

4. The microstrip antenna according to claim 1, wherein a size of a dielectric body in which the patch electrode is formed is equal to or smaller than 25 mm×25 mm, and the distance between each of the feed points and the center of the patch electrode is set to be larger than the distance in which the impedance is matched, so that an antenna gain in a frequency range of 1573.374 MHz to 1605.8865 MHz is equal to or larger than 1 dBic.

5. The microstrip antenna according to claim 1, wherein a size of a dielectric body in which the patch electrode is formed is equal to or smaller than 20 mm×20 mm, and the distance between each of the feed points and the center of the patch electrode is set to be larger than the distance in which the impedance is matched, so that an antenna gain in a frequency range of 1573.374 MHz to 1605.8865 MHz is equal to or larger than 0 dBic.

6. The microstrip antenna according to claim 1, wherein a size of a dielectric body in which the patch electrode is formed is 20 mm×20 mm×4 mm, and an antenna gain in a frequency range of 1573.374 MHz to 1605.8865 MHz is equal to or larger than 0 dBic.

7. The microstrip antenna according to claim 1, wherein a size of a dielectric body in which the patch electrode is formed is 25 mm×25 mm×7 mm, and an antenna gain in a frequency range of 1573.374 MHz to 1605.8865 MHz is equal to or larger than 3 dBic.

* * * * *